United States Patent [19]

Cohen et al.

[11] Patent Number: 4,567,578
[45] Date of Patent: Jan. 28, 1986

[54] CACHE MEMORY FLUSH SCHEME

[75] Inventors: Paul Cohen, Ashland, Mass.; William R Young, Palm Bay, Fla.

[73] Assignee: Harris Corporation, Melbourne, Fla.

[21] Appl. No.: 416,034

[22] Filed: Sep. 8, 1982

[51] Int. Cl.[4] .................. G11C 11/40; G11C 7/00
[52] U.S. Cl. .................. 365/189; 365/218; 365/230
[58] Field of Search .............. 365/189, 218, 203, 222, 365/230

[56] References Cited

U.S. PATENT DOCUMENTS

| 3,845,474 | 10/1974 | Lange et al. | |
| 3,979,726 | 9/1976 | Lanage et al. | |
| 3,980,899 | 9/1976 | Shimada et al. | 365/189 |
| 4,159,540 | 6/1979 | Smith et al. | |
| 4,172,291 | 10/1979 | Owens et al. | 365/189 |
| 4,236,207 | 11/1980 | Rado et al. | |
| 4,247,918 | 1/1981 | Iwahashi et al. | 365/218 |
| 4,360,901 | 11/1982 | Proebsting | 365/189 |
| 4,439,843 | 3/1984 | Takamatsu | 365/218 |
| 4,489,404 | 12/1984 | Yasuoka | 365/230 |

OTHER PUBLICATIONS

IBM Technical Disclosure Bulletin, vol. 20, No. 5 10/77.

Primary Examiner—Stuart N. Hecker
Assistant Examiner—Glenn A. Gossage
Attorney, Agent, or Firm—Barnes & Thornburg

[57] ABSTRACT

A method of setting a memory array to a common logic value by activating all the line switches by the precharge device for the duration of a word signal and simultaneously applying the common logic value directly to all the bit lines.

6 Claims, 6 Drawing Figures

4,567,578

CACHE MEMORY FLUSH SCHEME

BACKGROUND OF THE INVENTION

The present invention relates generally to memories and, more specifically, to a method of setting all the memory locations in an array to a single logic value.

During certain parts of a memory operation, it is desirable that the contents of the memory be cleared. Depending upon the type of memory, it may include a clearing at the initialization stage of the operation and others may require clearing during the middle of an operation sequence. A cache memory is a type of memory which needs clearing or flushing at the initialization as well as during normal operating cycles. A cache memory is a small, high-speed memory which contains a copy of selected blocks of main memory. These blocks are chosen by an algorithm which attempts to predict which portions of main memory will be needed in the near future.

Cache memories consist of two major functional blocks. These are the cache data array and the tag store. The cache data array contains copies of various blocks of main memory, and is generally high speed, and located physically close to the CPU. The tag store is an associative memory which contains the high order address bits of the blocks of data in the cache data array. On each memory reference, the tag store control circuitry accesses the tag store to determine if the represented memory block is in the cache data array. If the block is in the cache data array, the system then takes the appropriate action, depending on the type of memory reference (read, write, invalidate, etc.).

One of the functions which must be performed on the tag store is called a flush. The flush sets the valid bit to $\phi$ (invalid) on all tag store locations. This is performed at power-up, and periodically during system operation. The flush assures that the control circuitry does not signal a false cache bit. It is also desireable, for testing purposes, to set all bits of the tag store to a known state during a flush operation.

Previously, the flush was accomplished by sequentially writing a $\phi$ (invalid) into all valid bit locations. Since this is a sequential operation, it required a hardware counter, and approximately 500 microseconds to flush a 1K deep tag store. Other improvements have divided the tag store into sections and clearing the sections one at a time. All of these prior art methods require excessive time to clear the tag store. Other require additional circuitry to produce the signals required to clear the tag store.

SUMMARY OF THE INVENTION

An object of the present invention is to provide a new method of writing a common value simultaneously into all locations of a memory array.

Another object of the present invention is to provide a clearing of a cache memory within a single instruction cycle.

Still another object of the present invention is to provide a method of simultaneously clearing a cache memory requiring a minimum number of extra circuit elements.

These and other objects of the present invention are obtained by activating the word line switches for all the word lines without using the word decoder, transmitting a work signal through all of the activated word line switches and applying a desired common logic signal to all the bit lines without using the bit line decoder. The word line switches are activated by providing a signal to the precharged device connected to the input of the word line switches for the duration of the word signal being transmitted through the word line switches.

Further objects, advantages and novel features of the present invention will become apparent upon review of the detailed description of the preferred embodiment with the accompanying drawings.

DESCRIPTION OF THE PREFERRED EMBODIMENTS

Figure 1:
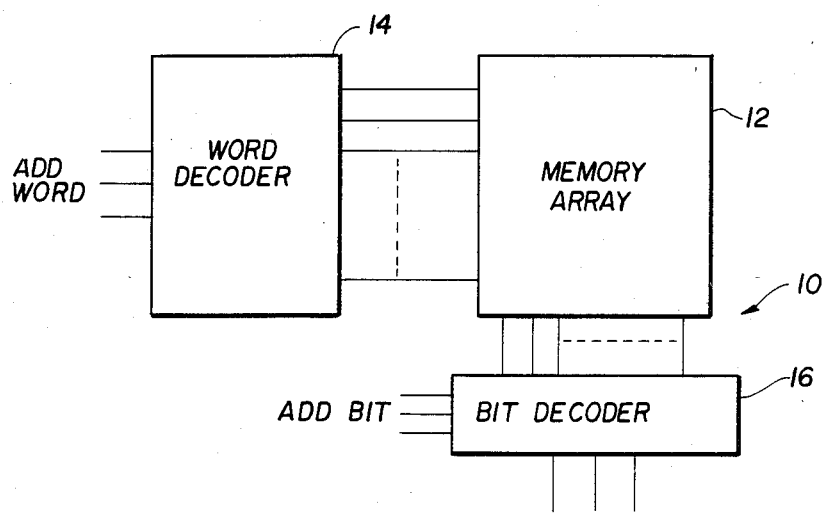
FIG. 1 is a block diagram of a memory.

A memory 10, as illustrated in FIG. 1, includes a memory array 12, a word line decoder 14 and a bit line decoder 16. The word line decoder 14 receives a word address and selects individual lines of the memory array 12. The bit decoder 16 receives a bit address bit word and decodes it to select unique bit lines or columns of the memory array 12 and provides them as an output.

Figure 2:
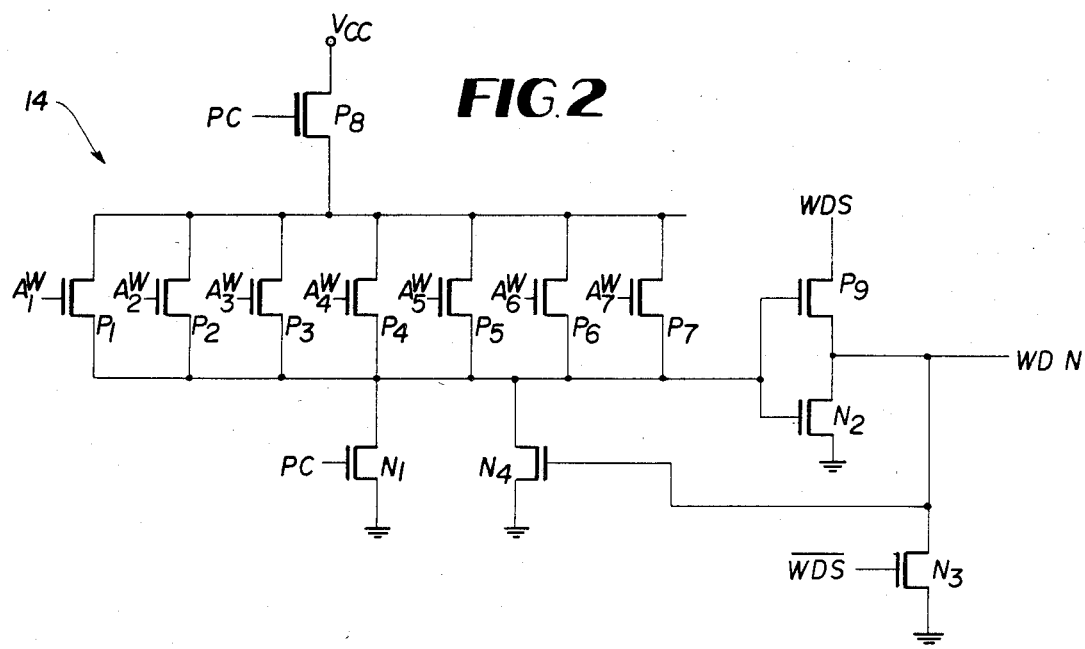
FIG. 2 is a schematic of a word decoder incorporating the principles of the present invention.

A word decoder 14 is illustrated in FIG. 2 as including a plurality of decoder transistors P1 through P7 having their source and drain paths connected in parallel and each one uniquely receiving word address AW on their gates. The sources of the decoder devices P1 through P7 are connected to a voltage supply VCC by a transistor P8 whose gate is controlled by a precharge signal PC. The drains of the address decoders P1 through P7 are connected to ground by a transistor N1 whose gate is controlled by a precharge signal PC. The common drains of the decoders P1 through P7 are connected to the input of a CMOS inverter including P9 and N2 which is a word line switch. The source of P9 is connected to the word signal WDS and the output of the inverter is connected to the word line WDN. Also connected to the word line WDN is transistor N3 whose source is grounded and whose gate receives WDS, the inverse of the word signal. Transistor N4 has its drain connected to the input of the inverter P9-N2, its source connected to ground and its gate connected to the word line WDN.

Figure 4:
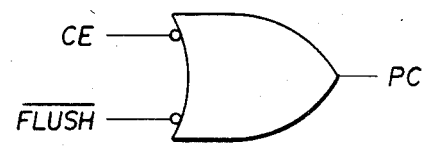
FIG. 4 is a NAND gate for generating PC.

The decoder 14 is a standard word decoder used in many memories. The modification for the present invention are the signals provided to the transistors N1 and P8. In normal operation, the gates of N1 and P8 are controlled by the inverse of the chip enable signal $\overline{CE}$. As illustrated in FIG. 4, the precharge signal PC is an output of a NAND gate whose input are the chip enable signal CE and the inverse of the flush signal FLUSH. The NAND gate of FIG. 4 maintains the transistor N1 on and P8 off except for the condition where you have a chip enable and no flush signal.

Figure 5:
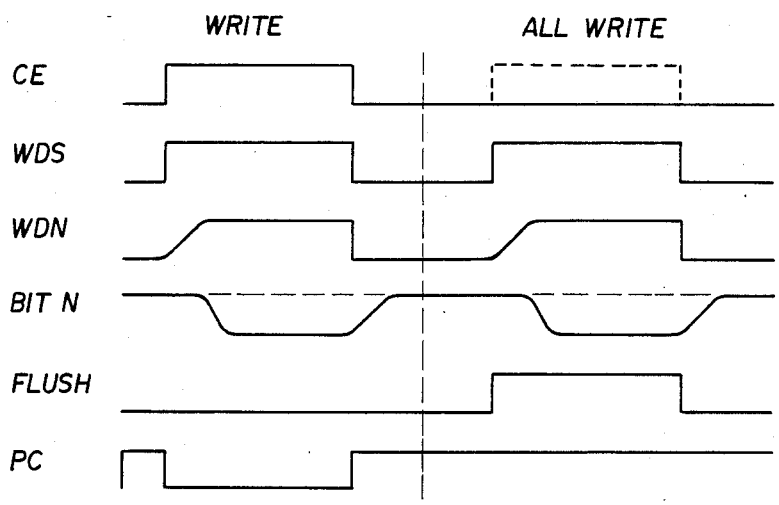
FIG. 5 are graphs of signals used to operate FIGS. 2, 3 and 4.

A normal cycle for the operation of the decoder of FIG. 2 is illustrated in the graphs of FIG. 5. At the beginning of a cycle, the chip enable CE and FLUSH are low which keeps P8 off and, therefore, no bias of VCC is provided to the sources of the decoder transistors P1 through P7. Also, the transistor N1 is turned on which grounds the input to the line switch inverter P9-N2 and removes any charge or current on the drains in the decoder transistors P1 through P7. The word line signal WDS is low and, therefore, transistor N3 is on which grounds the word line WDN and removes any charge or leakage current which may be on the word line due to the capacitance of the line switch inverter P9-N2.

Once the chip enable signal CE goes high, and the flush signal FLUSH is low, N1 is turned off and thereby removes the ground from the input of the line switch inverter P9-N2 and the drains of the decoders P1 through P7. Also, the transistor P8 is activated providing a VCC signal at the sources of the decoding transistors P1 through P7. If the unique address on all of the decoder transistors P1 through P7 is present, they are all turned off and, therefore, no VCC signal is provided on the input of the line switch inverter P9-N2. For this condition, the input signal is low from the precharge of N1 and the word signal WDS provided on the source of P9 is transmitted to the word line WDN. The word signal on the word line WDN is fed back to the gate of N4 which turns on and grounds the input thereby latching the word line switch inverter P9-N2 in a word signal transmission mode. The word line signal WDS going high turns off N3 and, therefore, removes the ground from the output of the word line switch inverter P9-N2.

If any of the decoder transistors P1 through P7 are not turned off, the supply signal VCC is applied to the input of the word line switch inverter P9-N2 and transistor N2 is turned on and transistor P9 is turned off. This grounds the word line WDN and prevents the word signal WDS from being transmitted to the word line WDN. Since the output on the word line WDN is low, transistor N4 is not turned on and, therefore, transistor N4 is not affected to latch the line switch P9-N2 in a word signal transmission mode. The operation at this point is the normal operation of the word decoder 14 and is illustrated in first section of graphs in FIG. 5 entitled WRITE.

For a flush operation, or an all write operation as illustrated in the signals of FIG. 5, the precharge signal PC is high which turns P8 off removing the biasing VCC from decoder section P1 through P7 and turns transistor N1 on grounding the input to the word line switch inverter P9-N2. This turns on P9. Since the flush signal is high for the total duration of an all write cycle, the line switch inverter P9-N2 is on for the total duration and transmits the word signal WDS to the word line. By using the transistor N1 as the control signal to maintain the word line switch on, all the word lines are activated for a flush or all write without using the decoder P1 through P7 of the respective line decoders.

Figure 6:
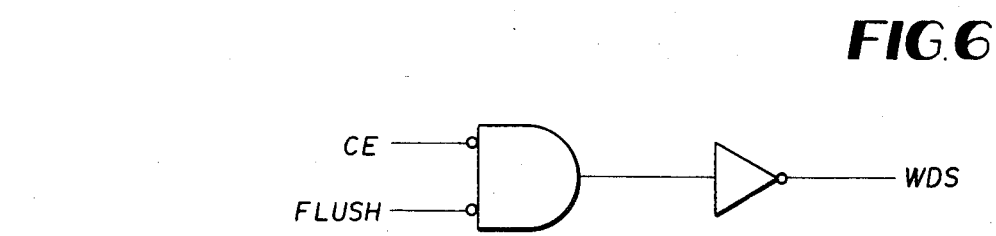
FIG. 6 is an OR gate for generating WDS.

The word signal WDS is generated as an OR function of the chip enable signal CE and the flush signal FLUSH by a NOR gate and inverter illustrated in FIG. 6. By using the OR function of the CE and FLUSH, an all write can be performed irrespective of the value of CE which is signified by the phantom CE high in FIG. 5. Thus, it can be seen by providing a NAND gate, as illustrated in FIG. 4, an OR function as illustrated in FIG. 6 and a flush signal, the word line decoder 14 will function so as to turn on all the word lines simultaneously without using the decoder section of the word line decoder. Thus, there is no structural change or added circuit for the word line decoders other than a single NAND gate of FIG. 4 and the effective OR of FIG. 6 for the total memory.

Figure 3:
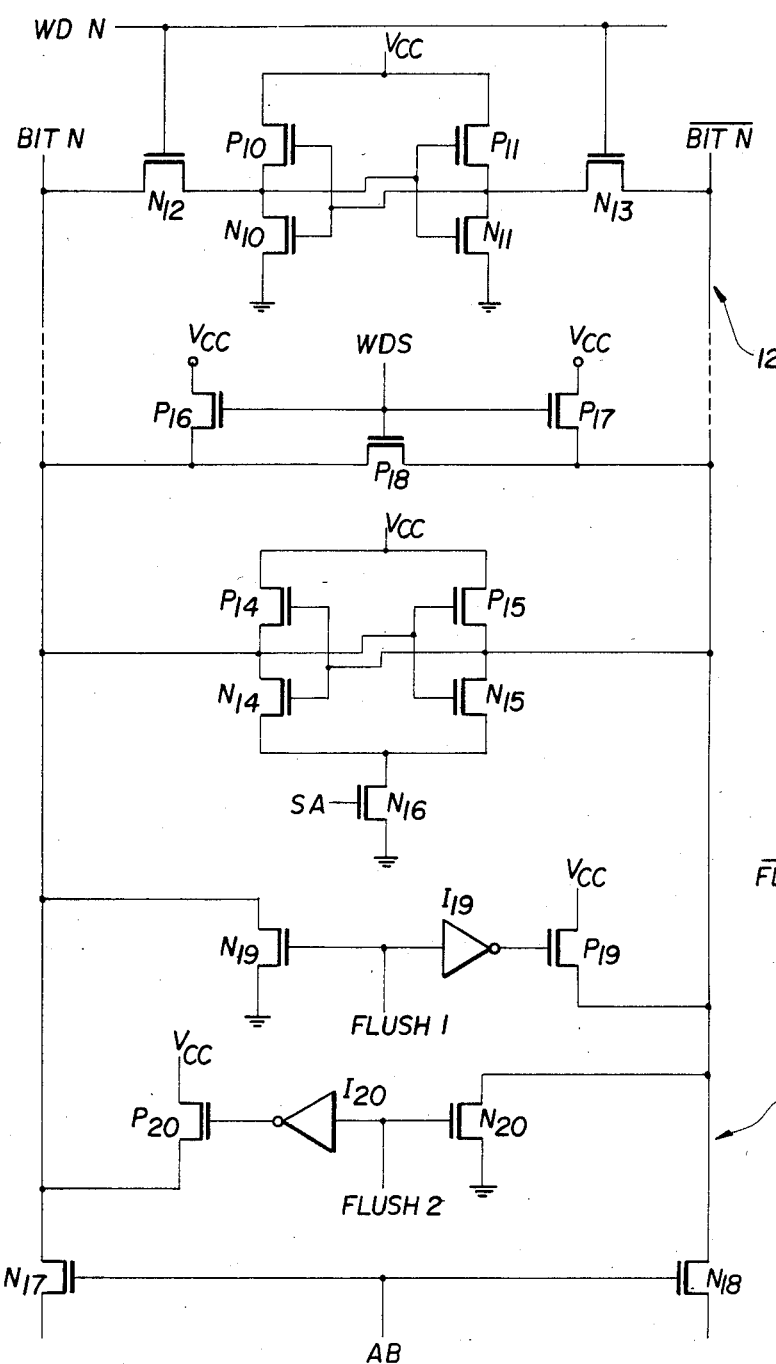
FIG. 3 is a schematic of a memory location and bit decoder incorporating the principles of the present invention.

A memory location of array 12 and the bit decoder 16 is illustrated in FIG. 3. The exemplary memory cell is illustrated including cross-coupled CMOS inverters including transistors P10, N10, N11. A pair of switches N12 and N13 connect the output of the inverters to the BIT N and $\overline{\text{BIT N}}$ lines. The gates of the switches N12 and N13 are controlled by the word line WDN. A sense amplifier is also connected between the bit lines BIT N and $\overline{\text{BIT N}}$ and includes cross-coupled CMOS inverters including transistors P14, N14, P15 and N15. Transistor N16 connects the sense amplifier to ground and its gate is controlled by the sense amplifier activate signal SA to activate or deactivate the sense amplifier.

The bit lines BIT N and $\overline{\text{BIT N}}$ are precharged by transistors P16, P17 and P18 whose gates are controlled by the word signal WDS. When the chip enable signal CE and flush signal are both low, then the signal WDS is low as produced by the NOR gate and inverter of FIG. 6. When the signal WDS is low, the transistors P16 and P17 connect the supply voltage VCC to the respective rails and transistor P18 balance the lines for any mismatch. The bit line decoder 16 is illustrated as including transistors N17 and N18 having their source-drain path in the bit lines BIT N and $\overline{\text{BIT N}}$, respectively, and their gates controlled by the bit address signal AB. The elements described so far are standard in a memory array and decoder and thus need no further explanation.

In order to accomplish a write of a common logic signal in the memory array, additional circuitry is provided. This is illustrated in FIG. 3 as including transistor N19 having its drain connected to the BIT N and its source grounded and a transistor P19 having its source connected to the signal VCC and its drain connected to the $\overline{\text{BIT N}}$ line. A FLUSH 1 signal is connected directly to the gate of transistor N19 and to the gate of transistor P19 through an inverter I19. When the FLUSH 1 signal is high, transistor N19 is turned on grounding the BIT N line and transistor 19 is turned on providing VCC on the $\overline{\text{BIT N}}$ line. This writes a logic low into all the memory locations connected to the BIT N and $\overline{\text{BIT N}}$ lines. N19, P19 and I19 are provided on all rails. Thus, for a single FLUSH 1 signal, all the bit rails are activated with the appropriate logic signal and since the word lines WDN are all activated, the whole memory array may be simultaneously written with a common logic value. In the example just cited, this is a logic low. It should be noted that the flush transistors N19 and P19 are connected directly to the bit rails and do not use the bit decoder N17 and N18 to have access to the lines.

Also illustrated in FIG. 3 is a second group of transistors for a second flush. This includes N20 having its drain connected to the $\overline{\text{BIT N}}$ line and its source connected to ground and transistor P20 having its source connected to VCC and its drain connected to the BIT N line. A FLUSH 2 signal is connected directly to the gate of transistor N20 and is connected to the gate of transistor P20 through inverter I20. When the FLUSH 2 signal is high, transistor N20 is turned on grounding the $\overline{\text{BIT N}}$ line and transistor P20 is turned on providing VCC on the BIT N line. Thus, a logic high is written into all the memory locations.

From the preceding description of the preferred embodiments, it is evident that the objects of the invention are obtained in that a common logic value may be written simultaneously into all locations of an array using a minimum amount of additional circuitry without the use of the decoder logic.

While the invention has been described and illustrated in detail, it is to be clearly understood that the same is by way of illustration and example only and is not to be taken by way of limitation. The spirit and scope of the present invention are to be limited only by the terms of the appended claims.

What is claimed is:

1. In a memory having a memory array, a word decoder and a bit decoder, the improvement comprising:

said word decoder including for each word line a word line switch means for connecting a word line signal to said word line when activated by said word decoder in response to a word address and a word precharge means for activating said word line switch prior to word decoding; and write means activating said word precharge means in response to an all write signal for connecting a word line signal to said word line and for writing a specific logic value in all the memory locations in said memory array simultaneously in response to said all write signal without addressing said word and bit decoders.

2. In a memory having a memory array, a word decoder and a bit decoder, the improvement comprising:

word means connected to all word lines of said memory array for activating all the word lines of said memory array in response to an all write signal during a low chip enable period without addressing said word decoder, and bit means connected to all the bit lines of said memory array for simultaneously writing a specific logic value into all the memory locations in said memory array via said bit lines in response to said all write signal without addressing said bit decoder.

3. The memory according to claim 2, including bit precharge means for precharging said bit lines, and wherein said word decoder includes for each word line disable means connected to each of said word lines for disabling all of said word lines during operation of said precharge means.

4. A method of writing a common logic value in a memory, said memory including a memory array, a word decoder for each word line in said array with a line switch for transmitting a word signal when activated by said word decoder in response to a word address, precharge means for activating said line switch in a precharge cycle, and a bit line decoder for each bit line comprising the steps of:

activating said precharge means to activate all said word line switches;

transmitting a word signal through all of said word line switches held activated by said precharge means; and applying a common logic signal to all said bit lines.

5. The method according to claim 4, wherein said step of applying a common logic signal to all said bit lines include providing said common logic signal directly to said bit lines without said bit line decoder.

6. In a memory having a memory array, a word decoder and a bit decoder, the improvement comprising:

said word decoder includes for each word line a word line switch means for connecting a word line signal to said word lines when activated by said word decoder in response to a word address;

word means connected to all word line switch means of said memory array for activating all the word line switch means of said memory array in response to an all write signal without addressing and irrespective of said word decoder to connect said word line signal to all said word lines; and bit means connected to all the bit lines of said memory array for simultaneously writing a specific logic value into all the memory locations in said memory array via said bit lines in response to said all write signal without addressing said bit decoder.

* * * * *